(12) United States Patent
Huynh

(10) Patent No.: US 7,414,496 B2
(45) Date of Patent: Aug. 19, 2008

(54) FILTER STRUCTURE AND METHOD FOR THE DESIGN OF A FILTER

(75) Inventor: Ngoc-Hoa Huynh, Forstinning (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/248,009

(22) Filed: Oct. 11, 2005

(65) Prior Publication Data

US 2006/0103487 A1   May 18, 2006

(30) Foreign Application Priority Data

Oct. 8, 2004   (DE) ............... 10 2004 049 196

(51) Int. Cl.
*H03H 9/54* (2006.01)
*H03H 3/02* (2006.01)

(52) U.S. Cl. ...................... 333/187; 333/189
(58) Field of Classification Search .............. 333/187, 333/189
See application file for complete search history.

(56) References Cited

U.S. PATENT DOCUMENTS

| 5,789,845 | A  | * | 8/1998  | Wadaka et al. ............ 310/334 |
| 6,323,744 | B1 | * | 11/2001 | Barber et al. ............. 333/189 |
| 6,377,137 | B1 | * | 4/2002  | Ruby ........................ 333/189 |
| 6,566,981 | B2 |   | 5/2003  | Urabe et al. |
| 6,677,835 | B2 | * | 1/2004  | Noguchi et al. ........... 333/193 |
| 6,838,956 | B2 | * | 1/2005  | Bradley ..................... 333/189 |
| 6,927,649 | B2 | * | 8/2005  | Metzger et al. ............ 333/133 |
| 6,985,052 | B2 | * | 1/2006  | Tikka ........................ 333/189 |
| 6,995,631 | B2 | * | 2/2006  | Taniguchi .................. 333/133 |
| 7,242,271 | B2 | * | 7/2007  | Komazaki .................. 333/193 |
| 2002/0089396 | A1 | | 7/2002 | Noguchi et al. |

FOREIGN PATENT DOCUMENTS

EP   1202455 A2   5/2002

OTHER PUBLICATIONS

Yun, Sang-Ki et al. "Parasitic Impedance Analysis of Double Bonding Wires for High-Frequency Integrated Circuit Packaging." *IEEE Microwave and Guided Wave Letters*. vol. 5. No. 9. Sep. 1995. p. 296-298. (3pages).

* cited by examiner

*Primary Examiner*—Barbara Summons
(74) *Attorney, Agent, or Firm*—Maginot, Moore & Beck

(57) ABSTRACT

A filter structure comprises a filter having an input port and an output port and a carrier to which the filter is attached having a reference potential area. The input port includes a first pad for receiving an input signal and a second pad for a first reference potential related to the input signal. The output port has a third pad for outputting an output signal and a fourth pad for a second reference potential related to the output signal. A first connecting wire contacts the second pad at a first connection point and the reference potential area at a second connection point. A second connecting wire contacts the fourth pad at a third connection point and contacts the reference potential area at a fourth connection point. A distance between the second and the fourth connection point is smaller than a distance between the first and the third connection point.

31 Claims, 8 Drawing Sheets

FILTER STRUCTURE AND METHOD FOR THE DESIGN OF A FILTER

CROSS-REFERENCE TO RELATED APPLICATION

This application claims priority from German Patent Application No. 10 2004 049 196.8, which was filed on Oct. 8, 2004, and is incorporated herein by reference in its entirety.

BACKGROUND OF THE INVENTION

1. Field of the Invention

The present invention generally relates to a filter and a method for the design of a filter, specifically to a reception filter for a duplexer having an optimized bonding diagram and an improved isolation and stop band suppression, and a method for its design.

2. Description of the Related Art

Today, high-frequency filters are used in a wide range of applications, wherein different filter types produced in different technologies are used depending on application and requirement profile. In many cases, it is useful to produce filters in a particular technology optimized for filter applications and then to connect them with the rest of the circuit produced in another technology. One example for this are bulk acoustic wave filters (BAW filters) or thin film resonator filters (TFR filters), which are produced on a special substrate and are then connected to the surrounding circuit produced in another technology. When, however, two high-frequency components are to be connected, there is the problem that, when producing a connection, there is a discontinuity of the wave guiding structure. This results in parasitic effects which may affect the properties of the overall structure to a higher or lesser extent. Examples of such effects are a discontinuous change of the wave impedance, which may lead to reflections, and coupling and radiation effects which may produce couplings between remote circuit parts. In the following, the connection of a BAW filter or a TFR filter to a carrier material is discussed by way of example. It may, for example, be a reception filter implemented as thin film resonator filter in a duplexer for a wireless communication terminal. However, the description is transferable to all cases in which a high-frequency filter having a filter input and a filter output is connected to a carrier material with the aid of connecting wires.

If a filter having an input port and an output port is used in which the reference potentials of the input port and the output port are separated from each other, two conductive connections have to be established at each port. Both a signal line and a reference potential line have to be inserted between the actual filter and the carrier material comprising conductive structures at the input port and at the output port. A relevant criterion for the evaluation of the overall filter is the filter characteristic as it may be measured on the carrier material. This filter characteristic particularly includes the parasitic effects caused by the connecting wires. Two effects are dominant. On the one hand, it is unavoidable that the connecting wires represent a comparatively high inductance. This inductance may lead to detuning of the filter, whereby pass frequency ranges and/or stop frequency ranges are shifted. Furthermore, the inductances of the connecting wires change the adaptation of the filter, which shows in a change of the filter characteristic and an increase of losses. Besides, a coupling between the filter input and the filter output may be generated by the connecting wires. Such a coupling may result in the stop attenuation of the overall filter in a stop range being reduced, which means a deterioration of the filter characteristic.

Due to the above effects, it is necessary to optimize the connection between the actual filter and the carrier material, which, in most cases, is established by bond wires. Here, the reference potential connections are particularly important.

Previous approaches rely on optimizing the bond connection at the input port of the filter and at the output port of the filter separately. In particular, the ground connections at the input port and the output port are also optimized separately. The optimizing goal according to prior art is to achieve a minimum inductance of the ground connections and a minimum coupling between input and output ports. The low coupling involves both the bond wires for the reference potential (ground) and the bond wires for the active signal lines (input signal, output signal).

FIG. 3 shows a top view of a possible duplexer circuit. It is designated 410 in its entirety. It comprises a transmission filter 420 and a reception filter 422 mounted on a laminate carrier 424. The duplexer circuit 410 further comprises an antenna terminal 430 and a transmitter terminal 432 and a receiver terminal 434. Both the transmission filter 430 and the reception filter 422 are connected to the laminate carrier by bond wires. The transmission filter comprises an input pad 440, an output pad 442 and three reference potential pads 444, 446, 448. The input pad 440 and the output pad 442 are attached to opposite narrow sides of the transmission filter 420. The reference potential pads 444, 446, 448, however, are located along a broadside of the transmission filter 420. The input pad 440 of the transmission filter 420 is connected to a metallization on the laminate carrier 424 by a first bond wire 460 running across the first narrow side 470 of the transmission filter. The first bond wire 460 does not run exactly perpendicular to the first narrow side 470 of the transmission filter 420, but is slightly inclined with respect to the perpendicular. Similarly, the output pad 442 is connected to a metallization from the laminate carrier 424 via a second bond wire 480. The second bond wire 480 runs across the second narrow side 490, wherein it is slightly inclined in its direction with respect to a direction perpendicular to the narrow side 490. The reference potential pads 444, 446, 448 are also connected to corresponding metallizations from the laminate carrier 424 via bond wires 510, 512, 514. The bond wires 510, 512, 514 for the reference potential run substantially perpendicular to the broadside 520 of the transmission filter 420. This applies particularly to the bond wire 510 associated with the input and the bond wire 514 associated with the output. These two bond wires 510, 514 are both perpendicular to the broadside 520 of the transmission filter 420. The distance between the points at which the bond wires 510, 514 contact the laminate carrier 424 is equal to the distance between the points at which the bond wires 510, 514 contact the transmission filter.

The reception filter 422 is also connected to metallizations on the laminate carrier 424 via bond wires. All terminals of the reception filter are located along a first narrow side 540 and a second narrow side 542 opposite to the first narrow side 540. Along the first narrow side 540, the reception filter 442 comprises an input pad 550 and a reference potential pad 552 associated with the input. Similarly, the reception filter 422 comprises an output pad 560 and an associated reference potential pad 562 along the second narrow side 542. The reference potential pad 552 on the input side is part of a reference potential area on the reception filter 422. The same applies to the reference potential pad 562 on the output side. The reference potential areas on the input side and the output side on the reception filter 422 are isolated from each other. The input pad 550 on the reception filter is connected to a metallization for the input signal on the laminate carrier 542 via a bond wire 570. The reference potential pad 552 on the input side is connected to reference potential areas on the laminate carrier 424 via three parallel bond wires 572, 574, 576. All bond wires 570, 572, 574, 576 on the input side run perpendicular to the first narrow side 540. The bond wires 572, 574, 576 for the reference potential are each chosen as short as technically possible and practicable. The same also applies to the bond wires 580, 582, 584, 586 on the output side. Thus it is to be noted that, in a conventional prior art duplexer circuit 410, the bond wires of the reception filter 422 on the input side and the output side run perpendicular to the first narrow side 540 and the second narrow side 542 of the filter, and that the reference potential wires 572, 574, 576, 582, 584, 586 are chosen as short as possible.

FIG. 5 shows an equivalent circuit diagram of a reception filter having a filter structure according to prior art. The equivalent circuit diagram describes a reception filter structure such as it is present in a prior art duplexer circuit 410. The entire equivalent circuit diagram is designated 610. The heart of the filter structure is the equivalent circuit diagram 620 of the reception filter. The equivalent circuit diagram 620 comprises four terminals. The input of the reception filter is formed by the input terminal IN with which there is associated a reference potential terminal GND_IN on the input side. The filter output is formed by an output terminal OUT and a reference potential terminal GND_OUT associated therewith.

The effect of the bond wire connecting the input pad 550 of the reception filter 422 to a metallization on the laminate carrier 424 is described by an inductance 630 whose magnitude may be estimated at 0.4 nH. Similarly, the bond wire 580 connecting the output pad 560 of the reception filter 422 to a conductor structure on the laminate carrier 424 may be modulated by an inductance 632 whose magnitude may also be estimated at 0.4 nH. The inductances 630 and 632, respectively, are connected in series to the input terminal IN and the output terminal OUT, respectively, of the reception filter model 620. Furthermore, one has to take into account the inductance of the bond wires connecting the reference potential area 552 of the reception filter 422 on the input side to a reference potential area on the laminate carrier 424. As these bond wires 572, 574, 576 are very short and as three bond wires are connected in parallel, the inductance is less than that of the bond wire 570 for the input signal. In an equivalent circuit diagram, the input side connection of the filter to the reference potential on the laminate carrier may be modulated by an inductance 640 which may be estimated at 0.25 nH. The same applies to the output side connection of the reception filter 422 to a reference potential area on the laminate carrier 424. Again, there will be an inductance 642 of about 0.25 nH. The distance of the connection points at which the bond wires 572, 574, 576, 582, 584, 586 for the reference potential on the input side and/or on the output side contact a metallization on the laminate carrier 424 is comparatively large (larger than the larger dimension of the filter). Therefore, an inductive coupling between the corresponding connection points on the input side and the output side may be considered as negligible. Correspondingly, a coupling inductance 650 on a metallization area (reference potential area) of the laminate carrier is to be regarded as very large. In a simplified modeling, the value of the coupling inductance 650 approaches infinity, which means that the impedance of the coupling inductance is very high. A large coupling inductance therefore means little coupling. Furthermore, the filter structure includes vias. They contribute an inductance of about 50 pH. The corresponding inductances are designated 660 and 662, respectively. Thus, the result is an equivalent circuit diagram of the filter structure in which two inductances 640, 642 are connected in series to the reference potential terminal GND_IN on the input side and the reference potential terminal GND_OUT on the output side, respectively. The inductances are each connected to the reference potential via the via inductances 660, 662. There is a coupling inductance 650 between the two branches whose value is assumed to be infinitely large in the present modeling, corresponding to a negligible coupling.

EP 1202455-A2 describes a variety of possibilities how to optimize the characteristic of a filter mounted to a carrier material by means of bond wires. The reference essentially follows the above rules. A fundamental goal of an embodiment according to the reference is to reduce the coupling between input and output ports. For this., the bond pads associated with the input port and the bond pads associated with the output port are arranged at a maximum distance from each other. Thus, the current loops of the filter input and the filter output are as distant as possible from each other. The area of the current loops at the filter input and the filter output is to be minimized according to the reference. This may be achieved by the bond pads associated with a port (i.e. active signal terminal and the associated reference potential terminal) being as close to each other as possible both on the actual filter substrate and on the carrier material. Furthermore, the reference teaches to use the shortest bond wires possible. In order to shorten the bond wires, it also helps to design the filter substrate as thin as possible. Finally, the reference recommends to design bond wires associated with different ports as orthogonal as possible, because this also helps to reduce the coupling. The cited reference also teaches to optimize the individual ground connections of the filter separately, whereby the inductances of the ground connections are typically minimized. It is a disadvantage of such an approach that the stop band suppression of a filter is thus narrow-band. Under certain circumstances, minimizing the bond wire inductances may further require additional inductances, for example for adaptation, which have to be realized on the carrier material. The result is that a larger housing is required than would be necessary without the use of external inductances.

SUMMARY OF THE INVENTION

It is the object of the present invention to provide a filter structure with an improved stop band suppression and a method for the design of such a filter structure.

In accordance with a first aspect, the present invention provides a filter structure having a filter including a bulk acoustic wave filter or a thin film resonator filter having an input port and an output port, wherein the input port includes a first pad for receiving an input signal of the bulk acoustic wave filter or thin film resonator filter and a second pad for a first reference potential to which the input signal is related, and wherein the output port has a third pad for outputting an output signal of the bulk acoustic wave filter or thin film resonator filter and a fourth pad for a second reference potential to which the output signal is related, and wherein the second pad and the fourth pad on the filter are isolated from each other; a carrier to which the filter is attached and which has a reference potential area; a first connecting wire contacting the second pad at a first connection point and contacting the reference potential area at a second connection point; and a second connecting wire contacting the fourth pad at a third connection point and contacting the reference potential area at a fourth connection point, wherein a distance d between the second connection point and the fourth connection point is smaller than a distance D between the first connection point and the third connection point.

In accordance with a second aspect, the present invention provides a method for the design of a filter structure having a filter including a bulk acoustic wave filter or a thin film resonator filter having an input port and an output port, wherein the input port includes a first pad for receiving an input signal of the bulk acoustic wave filter or thin film resonator filter and a second pad for a first reference potential to which the input signal is related, and wherein the output port has a third pad for outputting an output signal of the bulk acoustic wave filter or thin film resonator filter and a fourth pad for a second reference potential to which the output signal is related, and wherein the second pad and the fourth pad on the filter are isolated from each other, and a carrier to which the filter is attached and which has a reference potential area, an input signal area and an output signal area, and wherein the input signal area is connected to the first pad by a first connecting wire, and wherein the output signal area is connected to the third pad by a second connecting wire, and wherein the reference potential area is connected to the second pad by a third connecting wire, and wherein the reference potential area is connected to the fourth pad by a fourth connecting wire, the method having the steps of setting a first connection point at which the third connecting wire contacts the reference potential area and a second connection point at which the fourth connecting wire contacts the reference potential area; determining a filter characteristic of the filter structure including the first, the second, the third and the fourth connecting wire between a first port on the carrier and a second port on the carrier, wherein the first port is a region of the input signal area and includes a region of the reference potential area, and wherein the second port includes a region of the output signal area and a region of the reference potential area; checking whether the filter characteristic meets an optimization criterion; and repeating the steps of setting geometry parameters, determining a filter characteristic and checking whether the filter characteristic meets an optimization criterion, if the filter characteristic does not meet the optimization criterion, until the filter characteristic meets the optimization criterion or a cancelling condition has been reached, wherein, in the repetition of the step of setting the geometry parameters, the first connection point, the second connection point, a length, a quality or a shape of the third connecting wire or the fourth connecting wire is changed.

The present invention provides a filter structure with a filter including a bulk acoustic wave filter (BAW filter) or a thin film resonator filter (TFR filter) having an input port and an output port, wherein the input port includes a first pad for receiving an input signal of the bulk acoustic wave filter or the thin film resonator filter and a second pad for a first reference potential to which the input signal is related, and wherein the output port comprises a third pad for outputting an output signal of the bulk acoustic wave filter or the thin film resonator filter and a fourth pad for a second reference potential to which the output signal is related, wherein the second pad and the fourth pad on the filter are isolated from each other, a carrier to which the filter is attached and comprising a reference potential area, a first connecting wire contacting the second pad at a first connection point and contacting the reference potential area at a second connection point, and a second connecting wire contacting the fourth pad at a third connection point and contacting the reference potential area at a fourth connection point, wherein a distance between the second and the fourth connection point is smaller than a distance between the first and the third connection point.

The present invention further provides a method for the design of such a filter structure.

The central idea of the present invention is that it is advantageous to selectively influence an interaction between the reference potential terminals of the input port and the output port of the filter and to use them to optimize a transmission characteristic of a filter structure.

The present invention is based on the finding that a filter structure with improving properties with respect to conventional filter structures may be achieved by producing an interaction between the reference potentials of the input port and the output port which is larger than in conventional approaches only aiming at a mere minimization of the interaction.

Such an increased inductive interaction between the reference potentials at the input port and the output port of the filter may preferably be achieved by choosing the distance of the connection points at which the connecting wires for the reference potentials on the input side and the output side contact the reference potential area on the carrier smaller than the distance of the connection points at which these connecting wires contact the pads of the filter.

An inventive design of the reference potential connecting wires yields an inductive coupling of the two reference potentials via the reference potential area of the carrier. This increased inductive coupling results in improving the isolation and the stop band suppression of an inventive filter structure in their broadbandness. This is due to the fact that the additional inductive coupling overcouples signals from the filter input to the filter output in such a phase position that signals undesirably transmitted from the filter input to the filter output are opposed in the stop band of the filter. Additionally, an inductance larger than in conventionally optimized filters is introduced by the reference potential connecting wires arranged according to the invention. This increased inductance contributes to the adaptation of the filter on the input and the output side. Connecting wires arranged according to the idea of the present invention thus replace conventionally required external inductances. This allows a smaller design of the carrier on which conventionally further inductances have to be realized. This reduces the required housing size. An inventive filter may thus be produced smaller and in a more cost efficient way. This is very advantageous, particularly in portable applications and low cost consumer applications.

According to a preferred embodiment of the present invention, the connecting wires are bond wires connected to the pads of the filter and the reference potential area of the carrier. The use of bond wires has the advantage that they may be efficiently machine-attached also in very small structures. Additionally, the length and routing of the bond wires may also be influenced in a reproducible manner. This allows very selective influencing of the bond wire inductances and the overall filter characteristic.

The carrier material is preferably a laminate in which at least one conductive layer is deposited on an insulating layer, wherein the conductive layer is on a surface of the laminate so that it may be contacted with a connecting wire and/or bond wire without problems. The reference potential area is preferably part of this conductive layer. Besides, it is useful that all pads include conductive regions designed to allow the establishment of a durable conductive connection. Metallizations are particularly well suited for this, because they allow the formation of connections with low contact resistances.

It is further preferred that the filter is connected to the carrier. It is advantageous to glue the filter to the carrier, because gluing technology may be performed with comparatively little effort. Furthermore, due to the design of the filter structure, gluing is suited to keep mechanical stress for the connecting wires and/or bond wires low. The bond wires are relieved from any mechanical tasks and only have to ensure an electrical connection.

In one preferred embodiment, the reference potential area is designed so that it surrounds the surface region of the carrier at which the filter is connected to the carrier. Such a design allows to achieve especially strong interactions between the reference potential wires of the filter input and the filter output. An unbroken reference potential area helps to reduce an inductance between the second connection point and the fourth connection point. This is equivalent to a particularly strong coupling and/or interaction. Similarly, it is advantageous to place the reference potential area on the carrier as close as possible to the second contact area and the fourth contact area of the filter. This also allows an improvement of the coupling between the reference potentials of the filter via the reference potential area.

In a further preferred embodiment, the filter structure further comprises a third connecting wire designed to establish a connection between the second pad and the reference potential area, wherein the third connecting wire is shorter than the first connecting wire. Such a third connecting wire has the advantage that a connection between the reference potential area and the pad for the reference potential of the input port may be established with particularly low inductance. Coupling the filter input with low inductance results in a further improvement of the filter characteristic. The adaptation of the filter input is improved and detuning of the filter is avoided. An arrangement with three bond wires is therefore particularly advantageous. A low impedance coupling of the input and a coupling of reference potentials of the input and the output may be achieved at the same time. Preferably, the length of the third connecting wire is chosen as short as possible. Alternatively, a further fourth connecting wire may also be connected in parallel to the third connecting wire. Both shortening the third connecting wire and the use of several connecting wires connected in parallel reduces the inductance.

An inventive arrangement of the connecting wires is particularly advantageous in band pass filters designed to slightly attenuate a useful frequency range and to strongly attenuate an unwanted spurious frequency range. Particularly the stop characteristic of such a filter may be improved by an inventive arrangement.

Furthermore, it is advantageous when the BAW filter or the TF filter includes a resonator designed to filter the signals transmitted from the input port to the output port and including a first series resonator and a second series resonator as well as a first parallel resonator and a second parallel resonator, wherein the first series resonator is coupled to the first pad, wherein the second series resonator is coupled to the third pad, wherein the first parallel resonator is coupled to the second pad, and wherein the second parallel resonator is coupled to the fourth pad. Especially in such a resonator, the inductances of the reference potential connecting wires are particularly critical. In a filter structure as described above, they both contribute to the adaptation of input and output and determine pass and stop frequencies. Correspondingly, the use of an inventive concept in connection with such a filter is particularly advantageous, because here there is a large margin with respect to an improvement of the filter characteristic.

In a preferred embodiment, the first connecting wire and the second connecting wire are designed so that direct coupling is minimal. This has the advantage that direct coupling, which is difficult to control and which depends particularly on details of the routing of the respective bond wires, influences the properties of the filter structure only to a small extent. The coupling between the two reference potentials is rather substantially determined by an inductance of the reference potential area between the second and the fourth connection point. As the reference potential area may be very accurately defined geometrically, the corresponding coupling is well controllable. Therefore it is possible to reproduce the filter characteristic of the filter structure with good accuracy.

It is preferred to design the filter in its entirety so that a coupling inductance between the second and the fourth connection point is smaller than the wire inductance of the first connecting wire and the second connecting wire. This achieves that the connecting wires have an inductive effect, contributing to a good adaptation of the filter, while still guaranteeing a strong coupling of the reference potential on the input and the output side.

Furthermore, the present invention provides a method for the design of a filter structure. The design method takes up the central idea of the present invention that a selective adjustment of an interaction between the reference potential on the input and the output side allows an optimization of the transmission characteristic of a filter structure. Therefore, the inventive method includes an optimization of the position of the connection points at which the reference potential connecting wires connecting the filter to the carrier contact the reference potential area. The inventive design method differs drastically from conventional methods in which the corresponding connection points are not optimized, but are chosen according to heuristic rules so that the result is a minimal coupling. Thus there is a deviation from the conventional teaching which assumes that an optimization of the filter characteristic by a variation of the mentioned connection points is not possible and/or is only possible as part of a minimization of the coupling. Besides setting the mentioned connection points, the inventive method includes a determination of a filter characteristic of the filter structure, including the connecting wires, wherein the filter characteristic is determined between two locations on the carrier. Furthermore, there is a check whether the filter characteristic of a filter structure with a given geometry meets all optimization criteria. Finally, setting the connection points, determining the filter characteristic and checking the compliance with the optimization criterion are repeated until the optimization criterion is met. Here, the connection points, the length, the quality, the thickness or the shape of the connecting wires are changed in each step. The result of the optimization is a filter structure with an improved filter characteristic.

In one embodiment of the inventive method, the connection points in which the reference potential connecting wires contact the pads of the filter are also set. This has the advantage that there is a maximum freedom in the design of the reference potential wires. This is particularly helpful when extensive contact areas are available on the filter for the reference potential on the input side and the output side.

It is further preferred that the distance between the connection points at which the reference potential connecting wires contact the reference potential area on the carrier is smaller than the distance between the connection points at which the reference potential connecting wires contact the reference potential pads of a filter. Such a design results in a strong coupling between the reference potential on the input side and the output side, which is helpful for an optimization of the filter characteristic of the entire filter structure.

In a preferred embodiment, determining the filter characteristic includes constructing a corresponding filter and measuring the filter characteristic. Such a procedure is advantageous if other methods for determining the filter characteristic involve too much effort or are not practicable. This is particularly the case when the simulation of the filter characteristic is not possible or not useful, because too much effort with respect to memories and/or calculating time would be necessary for achieving adequate accuracy. Furthermore, constructing and measuring a filter structure allows to include process-induced tolerances. This is not possible in other, particularly simulative, methods for determining the filter characteristic.

On the other hand, it is preferred in some cases to determine the filter characteristic by a simulation of the filter with the help of a software executed on a programmable computer. This has the advantage that a filter does not have to be constructed, which, in some cases, may result in high costs. Based on a simulation, it is also easier to use a variety of geometry parameters in a fully automatic way. Finally, the use of software also allows to use mathematical optimization methods. Thus it is possible to perform an extrapolation based on several simulation results and to estimate how a further change of the geometry parameters may change the filter characteristic. Thus, it has to be decided from case to case whether constructing and measuring or simulating the filter structure is more advantageous for performing an optimization.

In a preferred embodiment, the optimization criterion deciding whether an optimization is successful includes a statement on whether the filter characteristic meets a given filter specification. Such an optimization criterion is advantageous because compliance with a given specification is to be considered a decisive criterion.

Furthermore, the optimization criterion may include a statement on whether a filter characteristic is better than a given reference filter characteristic of a reference filter structure with respect to a given feature that may be derived from the filter characteristic. By setting a feature that may be derived from the filter characteristic and that contains a quality statement on a filter characteristic, an efficient optimization is made possible. Ideally, it is apparent based on the set feature which filter characteristic from a plurality of filter characteristics satisfies the respective requirements best. Thus, a clear statement may be made whether the change of a particular geometry parameter will result in an improvement or a deterioration of the filter characteristic.

It is preferred to regard a filter structure as optimal when the set feature is better than in a given number of other filter structures for which the given feature was also determined. The features for the filter structures used for the comparison may have been determined either prior to the execution of the optimization method or in the course of the optimization method.

BRIEF DESCRIPTION OF THE DRAWINGS

Preferred embodiments of the present invention will be described in more detail in the following with respect to the accompanying drawings, in which.

DESCRIPTION OF THE PREFERRED EMBODIMENTS

Figure 1:
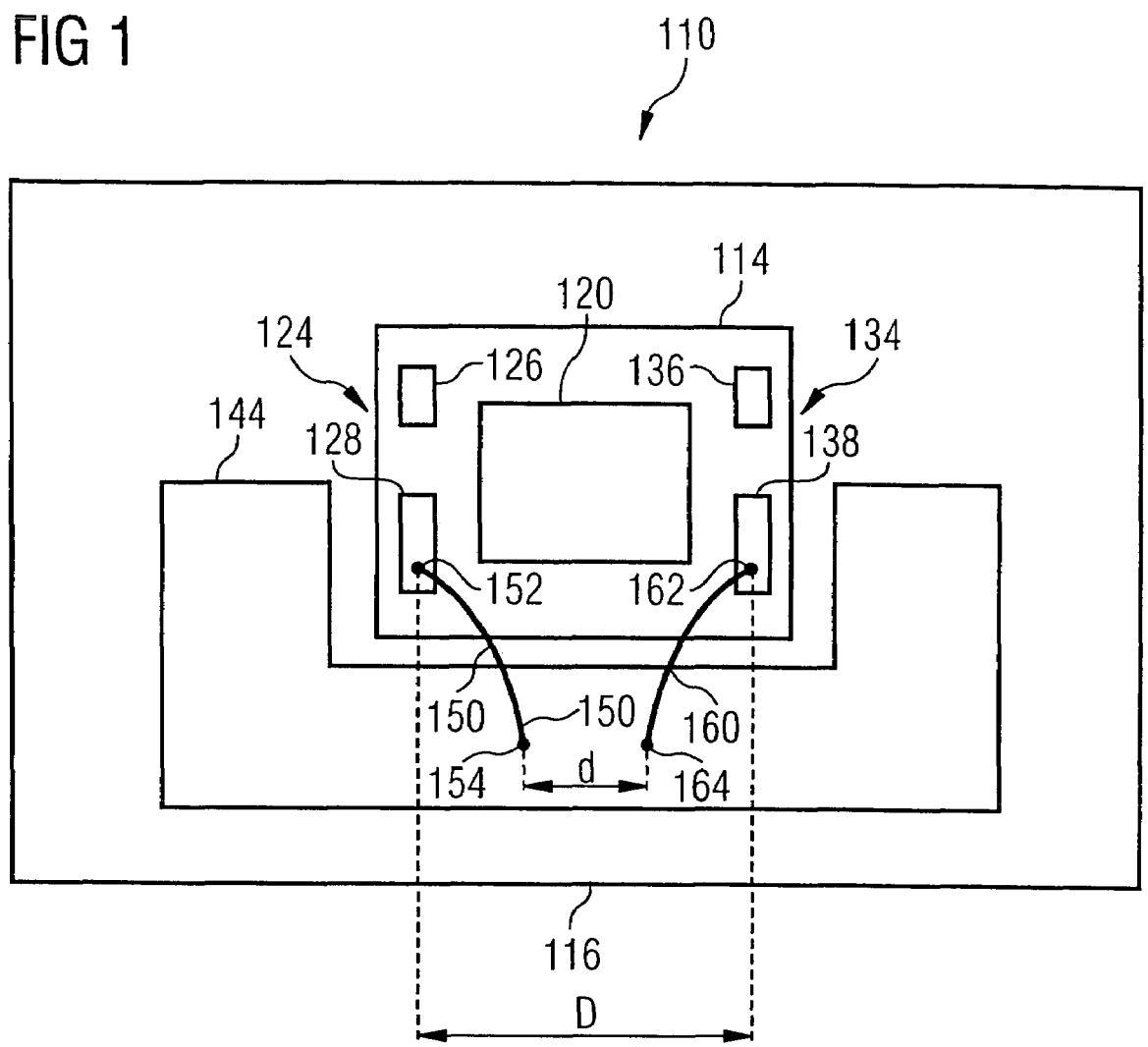
FIG. 1 is a top view of a simplified inventive filter structure according to a first embodiment of the present invention.

FIG. 1 shows a top view of a simplified inventive filter structure according to a first embodiment of the present invention. The filter structure is designated 110 in its entirety. The filter structure includes a filter 114 attached to a carrier 116. The filter 114 comprises a BAW filter or a TFR filter 120. Furthermore, the filter comprises an input port 124 including a first pad 126 and a second pad 128. Furthermore, the filter includes an output port 134 comprising a third pad 136 and a fourth pad 138. The carrier includes a reference potential area 144. The filter 114 is attached to the carrier 116 and, for example, mounted by gluing. The reference potential area 144 is designed so that it borders on the region in which the filter 114 is attached to the carrier 116. The filter structure 110 further includes a first connecting wire 150 contacting the second contact area 128 of the filter 114 at a first connection point 152 and contacting the reference potential area 144 at a second connection point 154. Similarly, there is a second connecting wire 160 contacting the fourth contact area 138 of the filter 114 at a third connection point 162 and contacting the reference potential area 144 in a fourth connection point 164. The distance between the first connection point 152 and the third connection point 162 is designated D, the distance between the second connection point 154 and the fourth connection point 164 is designated d.

The connection of the first pad 126 of the input port 124 designed for receiving an input signal of the BAW filter or the TFR filter and of the third pad 136 of the second filter port 134 designed for outputting an output signal of the BAW filter or the TFR filter is not shown for reasons of simplicity.

Based on the structural description, the operation of the filter structure described above will be discussed in more detail in the following. The BAW filter or the TFR filter 120 contained on the filter 114 performs the actual filter function. It is designed so that there is a high Q filter characteristic. In the present embodiment, the BAW filter or the TFR filter 120 has a band pass characteristic such that it only transmits a given frequency range, while adjacent frequency ranges are strongly attenuated. The BAW filter or the TFR filter comprises inputs and outputs led out to the input port 124 and the output port 134. At the input port 124, the filter includes a first contact area 126 designed so that an input signal may be launched via the same into the BAW filter or the TFR filter 124. The input port 124 further includes a second pad 128 providing a reference potential on the input side for the input of the BAW filter or the TFR filter 120. The input signal of the BAW filter or the TFR filter is thus characterized by potential difference between the first pad 126 and the second pad 128. Something similar applies to the output port 134. It includes a third pad 136 designed to output a signal from the output of the BAW filter or the TFR filter 120. The output port 134 further includes a fourth contact area 138 representing a reference potential contact for the output of the BAW filter or the TFR filter 120. The output signal of the BAW filter or the TFR filter is thus characterized by a potential difference between the third contact area 136 and the fourth contact area 138. Furthermore, it is necessary to connect the filter 114 attached on the carrier 116 with the same. Here, the connection is only shown for the reference potentials. On the side of the carrier 116, there is a reference potential area 144 serving for providing the reference potential for the filter 114. The connection between the reference potential area 114 and the second pad 128 for the reference potential of the input port 124 and the fourth pad 138 for the reference potential of the output port 134 is realized with connecting wires 150, 160. They are preferably bond wires. Furthermore, it is to be noted that, on the filter 114, there is no conductive connection between the second pad 128 for the reference potential of the input port 124 and the fourth pad 138 for the reference potential of the output port 134. It has been found, however, that a strong inductive coupling between the reference potentials of the input port 124 and the output port 134 contributes to an improvement of the filter characteristic of the filter structure 110. Therefore, the distance d between the connection points 154, 164 at which the connecting wires 150, 160 contact the reference potential area 144 is chosen smaller than the distance D of the connection points 152, 162 at which the connecting wires 150, 160 contact the second contact area 128 and the fourth contact area 138. Thus, the design of the connecting wires 150, 160 helps to reduce the overall inductance between the second pad 128 and the fourth pad 138.

The result of the shown geometric filter design and particularly the design of the connecting wires 150, 160 is an improvement of the filter characteristic. The suppression of the stop range of the band pass filter is improved. There may also be achieved a good adaptation of the input and the output without having to use further external inductances.

Figure 2:
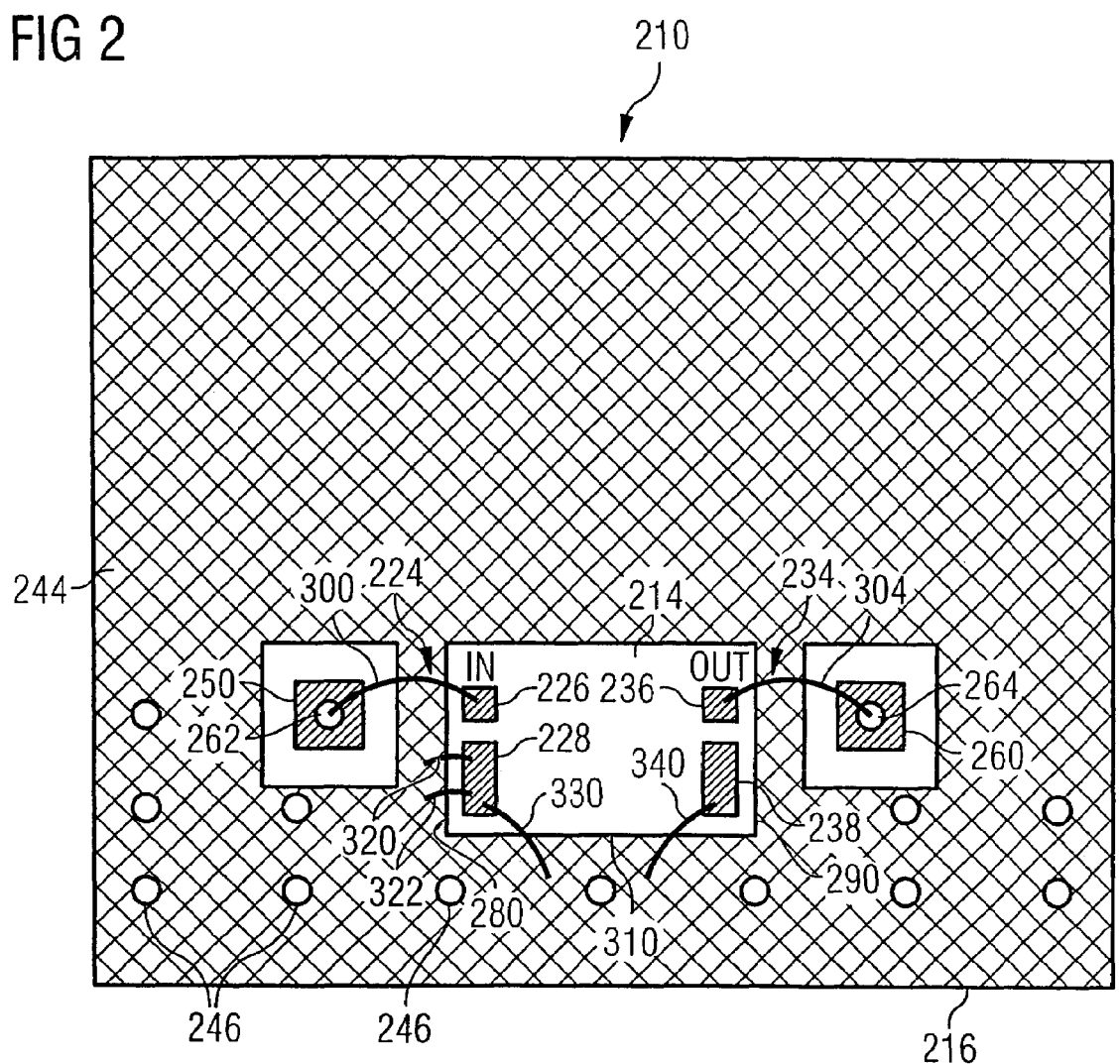
FIG. 2 is a top view of an inventive filter structure according to a second embodiment of the present invention.

FIG. 2 shows a top view of an inventive filter structure according to a second embodiment of the present invention. The filter structure is designated 210 in its entirety. It includes a filter 214 attached to a carrier 216. The filter comprises an input port 224 including a first pad 226 and a second pad 228. An output port 234 of the filter 214 includes a third pad 236 and a fourth pad 238. A reference potential area 244 is deposited on the carrier 116. It is part of the top metallization level of a laminate structure forming the carrier 216. The reference potential area 244 includes a large part of the surface of the carrier 216. In particular, it surrounds the region in which the filter 214 is attached to the carrier 216. Furthermore, it is to be noted that the reference potential area 244 formed by a metallization of the top metallization level of the carrier laminate is connected to further metallization layers conducting this reference potential through vias 246. Besides, the top metallization layer includes an input contact area 250 and an output contact area 260. By a via 262, 264, the input contact area 250 and the output contact area 260, respectively, are connected to a further metallization layer on which there are implemented transmission lines for supplying an input signal and/or for outputting an output signal of the filter 214.

It is further necessary to determine the geometric arrangement of the pads. The filter 214 has a rectangular shape. The first pad 226 of the input port 224 and the second pad 228 are arranged along a first narrow side 280 of the filter 214. The third pad 236 of the output port 234 and the fourth pad 238 are arranged along a second narrow side 290 of the rectangular filter 214, wherein the second narrow side 290 is opposite to the first narrow side 280. The input contact area 250 is arranged so that it gets close to the first narrow side 280. In the present embodiment, the input contact area 250 is arranged so that a connection between the centers of the input contact area 250 and the first pad 226 is approximately perpendicular to the edge of the first narrow side 280. Similarly, the output contact area 260 is arranged along the second narrow side 290 of the filter 214 so that it is approximately opposite to the third pad 236.

The first pad 226 of the input port 224 of the filter 214 is connected to the input contact area 250 by a bond wire 300. The bond wire is designed so that it directly connects the input contact area 250 to the first contact area 226, except for an unavoidable process-induced bending. Additionally, it is to be noted that also a difference in height in a direction perpendicular to the surface of the carrier (and thus perpendicular to the drawing level) has to be compensated with the bond wire. Due to technological reasons, this automatically forces a certain bending of the bond wire 300. Correspondingly, the third pad 236 of the output port 234 is connected to the output contact area 260 by a second bond wire 304.

The implementation of the connection between the second pad 228, the fourth pad 238 and the reference potential area 244 is very important for the function of the present filter structure 210. As described above, the second pad 228 is arranged along a first narrow side 280 of the filter 214, while the fourth pad 238 is arranged along the second narrow side 290 of the filter 214. Both pads are further arranged so that they are closer to a first broadside 310 of the filter 210 than the first pad 226 and the second pad 236. Furthermore, it is advantageous that the reference potential area 244 completely surrounds the filter 214. For a proper functioning of the circuitry, it is at least necessary that the reference potential area 244 gets sufficiently close to the filter at least in the region of the first narrow side 280 and the first broadside 210. The second pad 228 is connected to the reference potential area 244 by two bond wires 320, 322, which are referred to here as third bond wire 320 and fourth bond wire 322. The bond wires are designed so that they connect the second pad 228 to the reference potential area 244 in as short a way as possible across the first narrow side 280 of the filter 214. A projection of the bond wires 320, 322 is substantially perpendicular to an edge of the first narrow side 280 of the filter 214. Furthermore, the second contact area 228 is also connected to the reference potential area 244 by a fifth bond wire 330. The fifth bond wire 330 runs across the first broadside 310 of the filter 214 and contacts the reference potential area 244 in a region adjacent to the first broadside 310 of the filter 214. The fifth bond wire 330 is longer than the third and the fourth bond wire 320, 322 and runs diagonally to the edge of the broadside 310 of the filter 214. The fourth pad 238 is connected to the reference potential area 244 via a single bond wire, which is referred to as sixth bond wire 340 here. The sixth bond wire 340 contacts the reference potential area 244 just as the fifth bond wire 330 in a region adjacent to the first broadside 310 of the filter 214. Like the fifth bond wire 330, it runs diagonally to the edge of the first broadside 310 of the filter 214. The fifth and the sixth bond wire are further arranged so that the distance of the connection points in which the two bond wires 330, 340 contact the reference potential area 244 is less than the distance of the connection points at which the two bond wires 330, 340 contact the second pad 228 and the fourth pad 238.

Based on the structural description, the operation of the present filter structure 210 will be described in the following.

The description will particularly deal with the connection of the filter 214 to the metallization structures of the carrier 216. The first pad 226 is connected to the input contact area 250 via a first bond wire 300. Via this bond wire 300, essentially representing an inductance, the input signal is launched into the input port 224 of the filter 214. Similarly, the output signal is coupled out from the third pad 236 to the output contact area 260 at the output port 234 of the filter 214 via the second bond wire 304. However, the position of the reference potential bond wires 320, 322, 330, 340 is crucial for the operation of the filter structure 210. The third and the fourth reference potential bond wire 320, 322 form a very low impedance via which the second pad 228 provided for the reference potential of the input port 224 is connected to the reference potential area 244 of the carrier 216. The use of very short bond wires for the third and the fourth bond wire 320, 322 reduces the inductance, just as the parallel connection of two bond wires 320, 322. Thus there is only a low impedance between the reference potential area 244 and the second pad 228 of the filter 214. This optimally allows the launching of the input signal into the input port 224 of the filter 214. Furthermore, the fifth and the sixth bond wire 330, 340 are arranged so that their connection points with the reference potential area 244 are close to each other. The fifth and the sixth bond wire 330, 340 are longer than the third and the fourth bond wire 320, 322, so that their inductances are larger. However, as the connection points with the reference potential area are close to each other, the inductance between the fifth and the sixth bond wire 330, 340 on the reference potential area 244 of the laminate carrier 216 is reduced. Thus, there is only a low impedance between the connection points with the fifth and the sixth bond wire 330, 340 on the reference potential area 244. This allows coupling the reference potentials applied to the second pad of the input port and the fourth pad of the output port. This results in an improvement of the filter characteristic, because the coupling is such that there is a further reduction of the signal to be suppressed in a stop frequency range of the filter 214. Additionally, due to the inductances of the fifth and the sixth bond wire, which are larger than the inductances of the third and the fourth bond wire, there is an adaptation of the filter input and the filter output which conventionally has to be achieved by external inductances.

The filter structure 210 may be changed within a large scope without leaving the central idea of the invention. In particular, the input contact area 250 and the output contact area 260 may be implemented in any way.

Furthermore, major changes with respect to the reference potential area 244 are possible. It is not necessary that the reference potential area 244 surrounds the filter 214. It is sufficient if it borders on the filter in the regions in which bond wires are routed onto the reference potential area. It is also conceivable that the reference potential area is also present in the region in which the filter is attached. Therefore no recess is necessary at the location of the filter. Furthermore, it is not required that the reference potential area comprises vias. Any arrangement is conceivable that allows to connect the reference potential areas to an adjoining circuitry. Furthermore, the arrangement of the pads along the circumference of the filter is arbitrary. The only thing crucial for the invention is that the connection points at which the fifth and the sixth bond wire contact the reference potential area 244 have a smaller distance than the connection points at which the fifth and the sixth bond wire contact the second and the fourth pad 228, 238. Thus also the shape of the filter is not relevant for the invention and may be changed. A rectangular shape is not necessary, there may rather be used any shape allowing a realization of the inventive idea. Furthermore, it is possible to connect the filter to the carrier 216 in various ways. The filter 214 may be glued, soldered or mounted by any other fixing method to the carrier 216. It is also possible that the carrier 216 includes a recess into which the filter 214 may be inserted. Then the mounting is again possible by gluing, casting, clamping or any other conceivable method. Furthermore, the material of the carrier 216 may vary in a wide range. In addition to a laminate, there may also be used a ceramic substrate, a printed circuit board material (for example FR 4) or a semiconductor material (for example silicon, gallium arsenide, and others), as long as it is guaranteed that conductive connections (such as the reference potential area 244) may be produced on the material.

Figure 3:
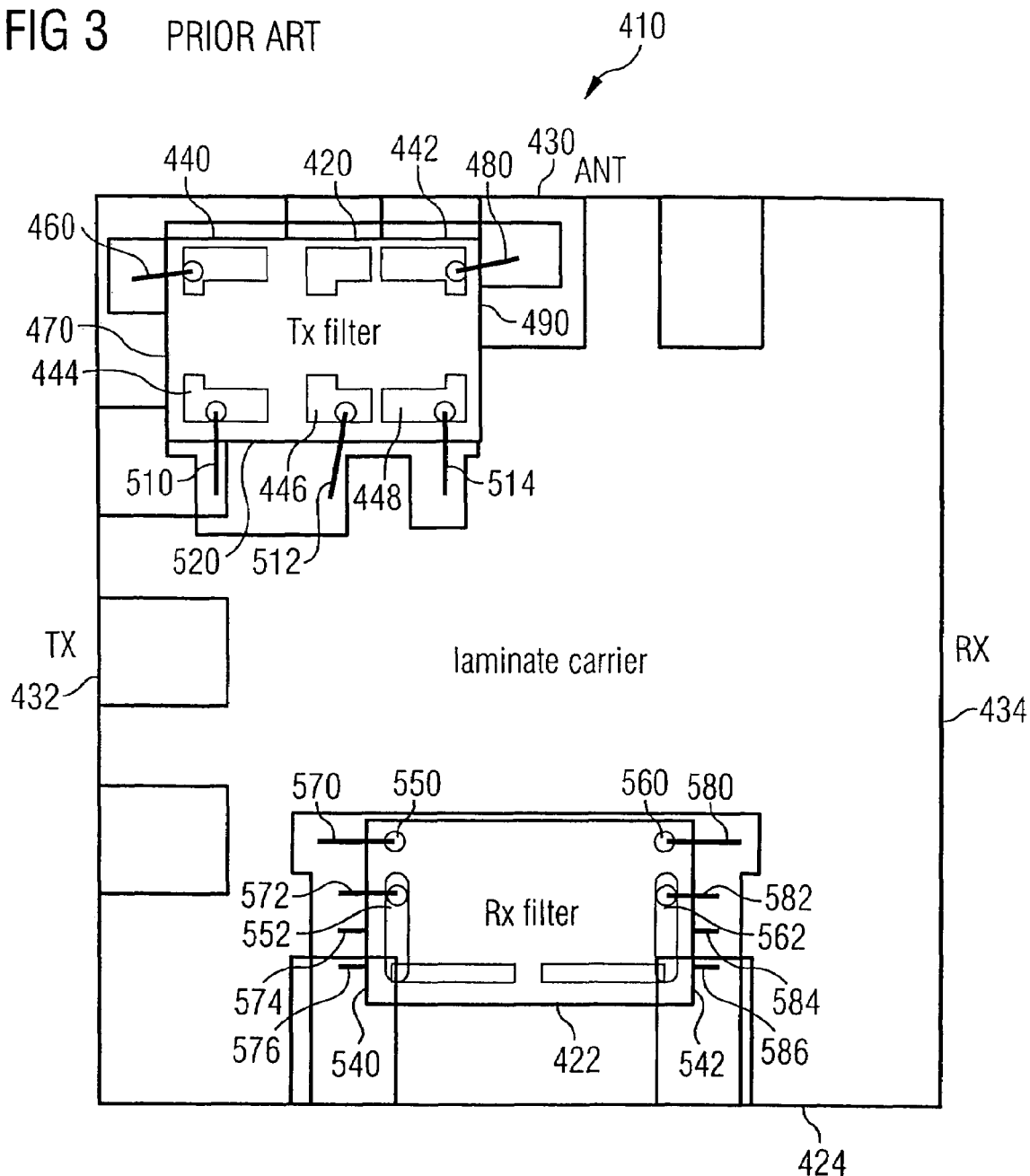
FIG. 3 is a top view of a prior art duplexer circuit.
Figure 4:
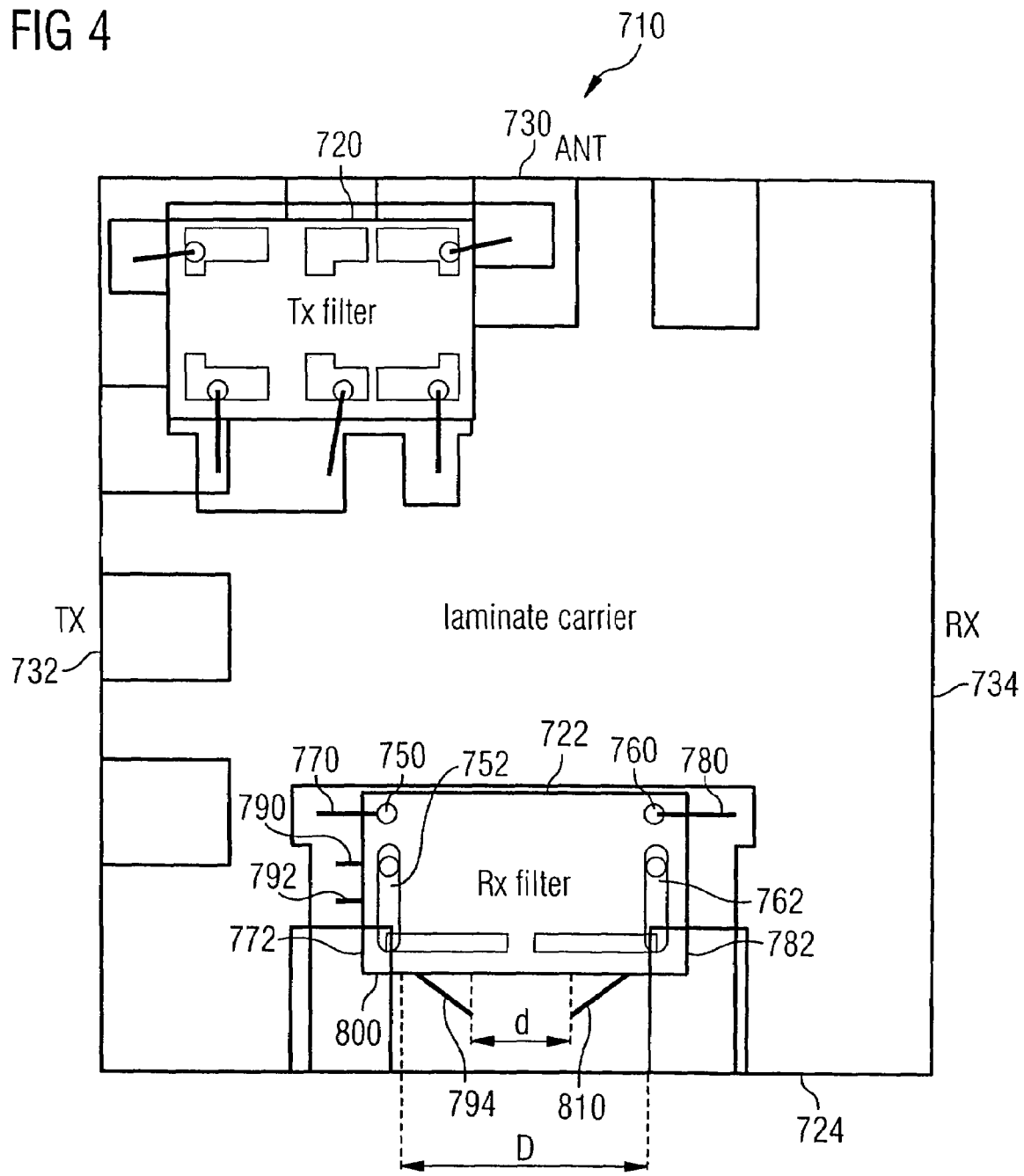
FIG. 4 is a top view of a duplexer circuit having an inventive filter structure according to an embodiment of the present invention as reception filter.
Figure 5:
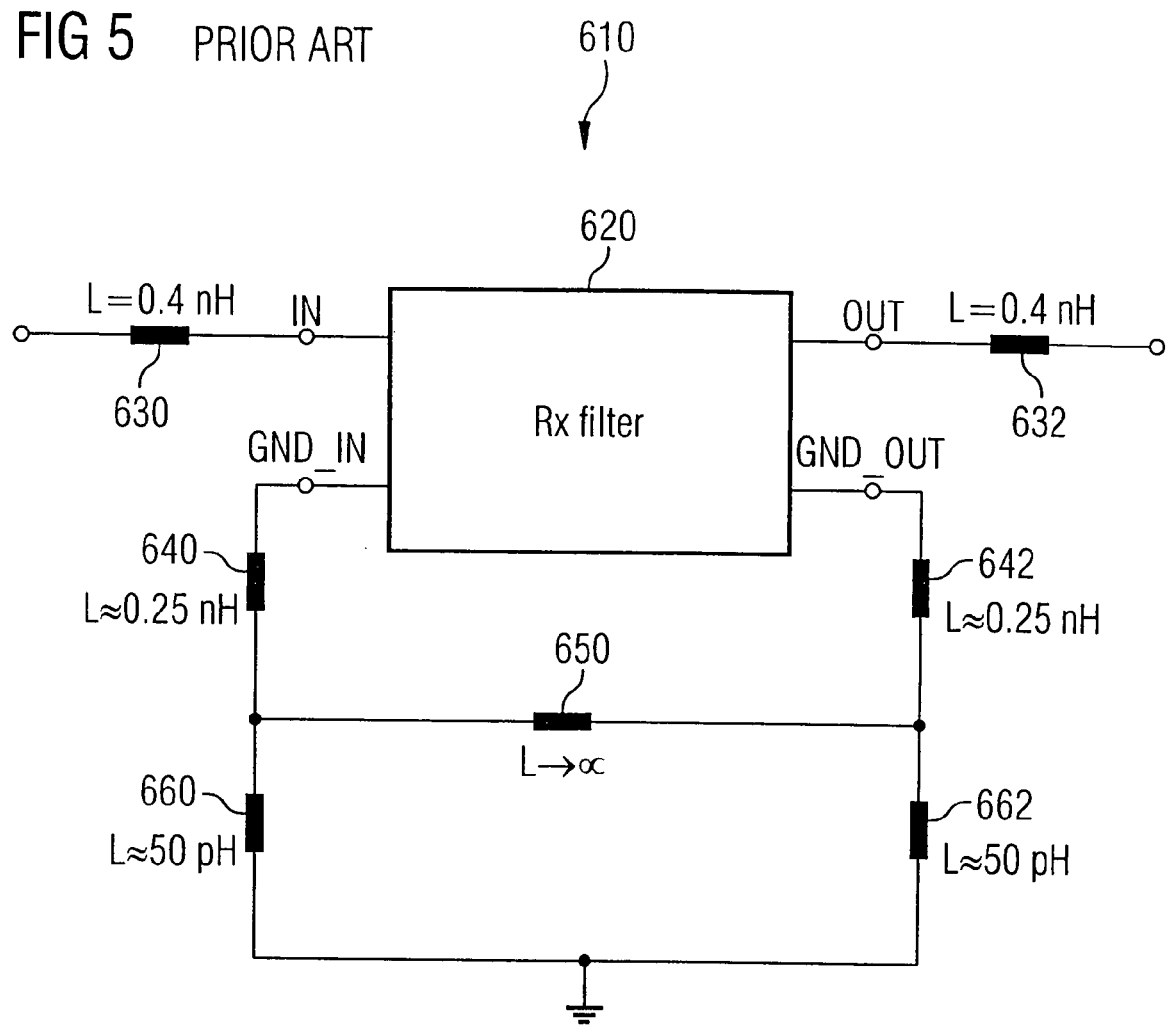
FIG. 5 shows an equivalent circuit diagram of a reception filter having a filter structure according to prior art.

FIG. 4 shows a top view of a duplexer circuit having an inventive filter structure according to an embodiment of the present invention as reception filter. The duplexer circuit is designated 710 in its entirety. It includes a transmission filter 720 and a reception filter 722 which are attached to a laminate carrier 724. Furthermore, the duplexer circuit 710 comprises an antenna terminal 730, a transmitter terminal 732 and a receiver terminal 734. The connection of the transmission filter 720 corresponds to that of the transmission filter 420 of the duplexer circuit 410 shown and described with respect to FIG. 3 (prior art). Thus, this corresponds to prior art and is not described in its entirety herein. However, there are changes with respect to prior art regarding the reception filter 722. The reception filter again comprises an input pad 750 and an associated reference potential pad 752. Similarly, the reception filter 722 comprises an output pad 760 and a reference potential pad 762 on the output side. The input pad 750 is connected to a metallization on the laminate carrier 724 via a bond wire 770. The bond wire runs perpendicular to a first narrow side 772 of the reception filter 722 along which there are arranged the input side pads 750, 752. Similarly, the output pad 760 is connected to an output metallization on the laminate carrier 724 via a bond wire 780, wherein the bond wire 780 runs perpendicular to a second narrow side 782 of the reception filter 722 along which there are arranged the output side terminals. The reference potential pad 752 on the input side is connected to the reference potential area on the laminate carrier 724 via three bond wires 790, 792, 794. Two of the bond wires 790, 792 run perpendicular to the first narrow side 772 and are chosen as short as possible. A further bond wire 794 extends from the reference potential pad 752 on the input side to a point of the reference potential metallization on the laminate carrier 724 which is next to the first longitudinal side 800 of the reception filter 722. The corresponding bond wire 794 runs diagonally across the edge of the first longitudinal side 800 of the reception filter 722.

The reference potential pad 762 on the output side is connected to a reference potential area on the laminate carrier 724 via only one bond wire 810. The bond wire 810 is routed so that it runs diagonally across the reception filter 722 from the potential pad 762 on the output side and contacts the reference potential area of the laminate carrier 724 in a point which is next to the first longitudinal side 800 of the reception filter 722. The bond wire 810 runs diagonally to the edge of the first longitudinal side 800 of the reception filter 722. The distance of the points in which the two diagonal bond wires 794, 810 connecting the reference potential pad 752 on the input side and the reference potential pad 762 on the output side to the reference potential metallization on the laminate carrier 724 contact the reference potential area on the laminate carrier is designated d. This distance d is smaller than the distance of the reference potential pads 752, 762 on the input and the output side, which is designated D.

Figure 6:
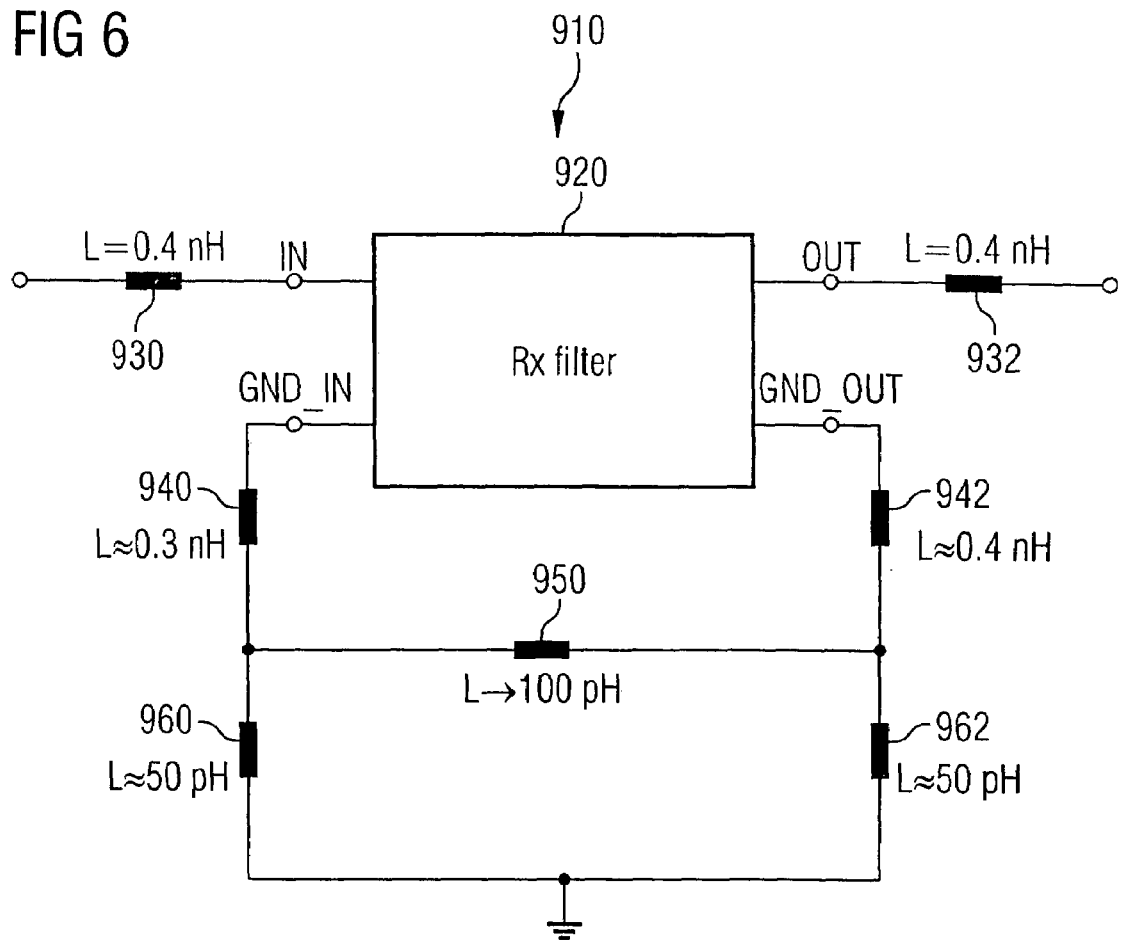
FIG. 6 shows an equivalent circuit diagram of a reception filter having an inventive filter structure according to an embodiment of the present invention.

FIG. 6 shows an equivalent circuit diagram of a reception filter having an inventive filter structure according to an embodiment of the present invention. The equivalent circuit diagram is designated 910 in its entirety and describes a reception filter structure that may be used, for example, in the duplexer circuit 710 described with respect to FIG. 4. The heart of the equivalent circuit diagram is a model (equivalent circuit diagram) of the reception filter designated 920. The bond wire 770 connecting the input pad 750 to an input metallization on the laminate carrier 724 again represents an inductance indicated by 930 in the equivalent circuit diagram and which may be estimated at about 0.4 nH. Likewise, the bond wire 780 on the output side may be represented by an inductance 932 of about 0.4 nH. The inductances 930, 932 are connected in series to the input terminal IN and the output terminal OUT of the reception filter 920 in the equivalent circuit diagram 910.

The bond wires 790, 792 and 794 for the reference potential on the input side may be represented by an inductance 940 which may be estimated at about 0.3 nH and which is connected in series to the reference potential terminal GND_IN on the input side of the reception filter 920 in the equivalent circuit diagram. The bond wire 810 establishing the connection to the reference potential on the output side corresponds to an inductance 942 of about 0.4 nH connected in series to the reference potential terminal GND_OUT on the output side. The distance in which the bond wires 794, 810 for the reference potential on the input and the output side, which are routed towards each other, contact the reference potential metallization on the laminate carrier 724 is designated d. As the distance d is comparatively small (smaller than the distance D between the reference potential pad of the reception filter 722 on the input side and the output side and thus also smaller than the distance of the connection points in which the reference potential bond wires contact the reference potential pads), there is a strong coupling between the points in which the bond wires 794, 810 contact the metallization on the laminate carrier 724. This coupling is modulated by the coupling inductance 750. The coupling inductance is low and may be estimated at 0.1 nH. Furthermore there are vias through which the reference potential metallization on the upper side of the laminate carrier 724 is connected to a reference potential metallization on another layer of the laminate. These vias contribute inductances which are designated 960 and 962 here and whose magnitude may be estimated at about 50 pH.

With respect to the equivalent circuit diagram, the inventive reception filter structure differs from a conventional reception filter structure in that the inductances of the reference potential connections change. In an inventive arrangement, there are now only two short bond wires 790, 792 and one long bond wire 794 on the input side instead of three short bond wires 572, 574, 576. This means that, with about 0.3 nH, the associated inductance 940 in an equivalent circuit diagram with an inventive filter is slightly larger than the inductance 640 in the equivalent circuit diagram of a reception filter structure according to prior art. Likewise, the inductance of the reference potential connection on the output side increases considerably, because only one long bond wire 810 is used in an inventive filter structure instead of three short bond wires 582, 584, 586 connected in parallel. This can be seen from the fact that the inductance 942 in the equivalent circuit diagram of an inventive filter structure is significantly larger (0.4 nH) than the corresponding inductance 642 in the equivalent circuit diagram of a conventional reception filter structure (0.25 nH). There is also a significant change with respect to the coupling of the reference potential on the input side and the output side. In the inventive reception filter structure, the coupling is very strong which is reflected in a small coupling inductance 950 of only about 100 pH. In the conventional reception filter structure, however, the coupling inductance 650 is very large so that it is considered infinite in a simplified equivalent circuit diagram.

The strong coupling between the reference potential on the input side and the output side in an inventive filter structure causes the stop band suppression to improve. In the case that the reception filter 920 is operated in stop operation, due to imperfections of the filter, the result is that still a signal is transmitted to the filter output. A measure that may be taken against this is the inductive coupling of the reference potential on the input side and the output side. A signal caused by the inductive coupling which is overcoupled from the input to the output has such a phase position that it opposes the signal undesirably transmitted from the filter input to the filter output in the stop operation. Thereby, the stop attenuation of the whole filter structure 910 is improved, which represents an important feature for the performance of the filter.

Figure 7:
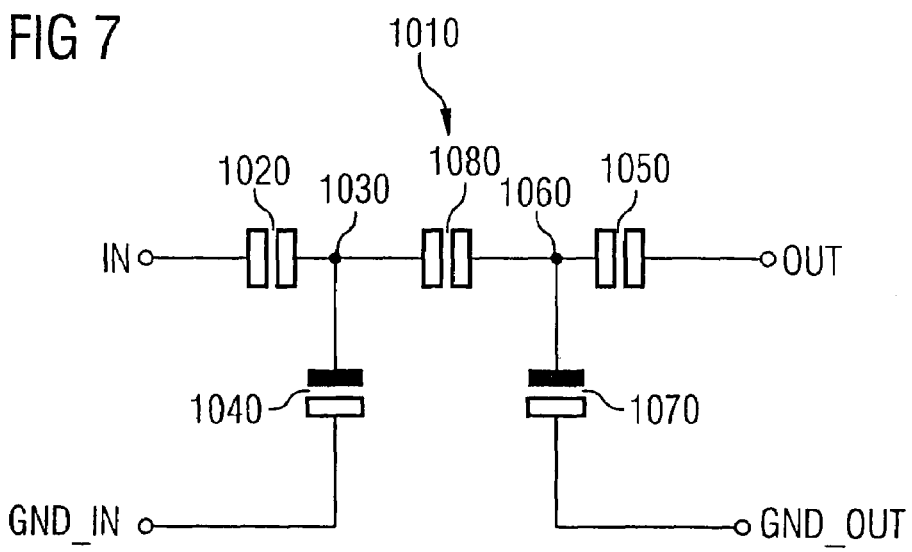
FIG. 7 shows an equivalent circuit diagram of a BAW filter or a TFR filter for use in an inventive filter structure according to an embodiment of the present invention.

FIG. 7 shows an equivalent circuit diagram of a BAW filter or a TFR filter for the use in an inventive filter structure according to an embodiment of the present invention. The BAW filter or the TFR filter is designated 1010 in its entirety. It comprises a signal input IN and an associated reference potential terminal GND_IN on the input side. There is further a signal output OUT and an associated reference potential terminal GND_OUT. The reference potential terminals GND_IN and GND_OUT on the input side and the output side are isolated from each other. A first series resonator 1020 is coupled to the filter input IN, while a second terminal of the first series resonator 1020 is connected to an internal node 1030. A first parallel resonator 1040 is connected between the first internal node 1030 and the reference potential terminal GND_IN on the input side. The output terminal OUT of the BAW filter or the TFR filter is coupled to a second internal node 1060 via a second series resonator 1050.

Furthermore, a second parallel resonator 1070 is connected between the second internal node 1060 and the reference potential terminal GND_OUT on the output side. Finally, the first internal node 1030 and the second internal node 1060 are coupled via a third series resonator 1080.

A described BAW or TFR filter structure 1010 is suited to realize a high Q band pass filter. The series resonators let frequencies close to the resonant frequency pass, while they block other frequencies. The parallel resonators represent an open for the resonant frequency, while frequencies remote from the resonant frequency are shorted towards the reference potential.

Advantages of an inventive filter structure become apparent particularly in filters with a structure as described above. This is due to the fact that the phase ratios for frequencies within the stop range are such that the inductive coupling between the reference potentials of the filter input and the filter output, as achieved by an inventive filter structure, contributes to an improvement of the stop band attenuation. However, it is possible to change the filter structure and still obtain the inventive advantages. In particular, it is possible to add additional filter stages to the filter. The only thing that is decisive here is that the separation of the grounds on the input side and the output side is maintained.

Figure 8:
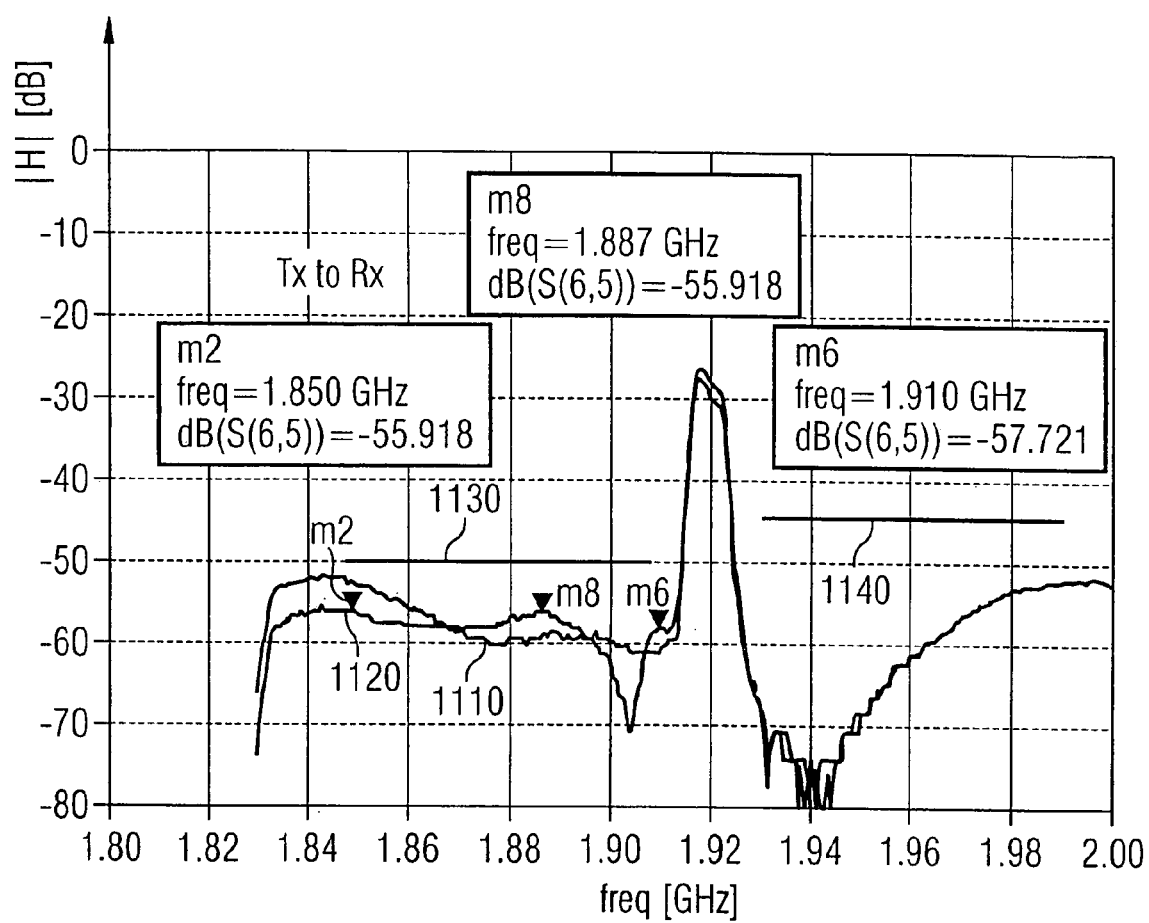
FIG. 8 shows a transmission characteristic of a reception filter according to prior art and of a reception filter having an inventive filter structure according to an embodiment of the present invention.

FIG. 8 shows the transmission characteristic of a reception filter according to prior art and of a reception filter having an inventive filter structure according to an embodiment of the present invention. The frequency in a frequency range from 1.8 GHz to 2.0 GHz is plotted on the abscissa, while the ordinate shows the magnitude of the transmission characteristic H from a filter input to a filter output in logarithmic form. Filter input and filter output are chosen on the carrier laminate so that the transition from the carrier to the actual filter is taken into account. The first graph 1110 shows the transmission characteristic of a conventional reception filter structure, while the second graph 1120 shows the transmission characteristic for an inventive reception filter structure. There are further plotted limits 1130, 1140 which have to be observed by a filter characteristic according to the application specifications. The limits describe the allowable minimum stop range attenuation.

It can be seen from the transmission characteristic that the inventive filter structure and a conventional filter structure behave nearly identically within the pass range (around 1.92 GHz) and above the pass range. For frequencies below the pass range, the insertion attenuation is always larger than 55 dB for the inventive filter. The minima of the insertion attenuation are at 1.850 GHz, 1.887 GHz and 1.910 GHz. However, a value of at least 55 dB is reached at all minima. This is not guaranteed for a conventional filter according to the first filter graph 1110. Instead, such a filter has an insertion attenuation of only about 52 dB at 1.845 GHz. It can therefore be seen that an inventive filter structure exhibits a minimum insertion attenuation which is better by 3 dB in the lower stop band (between 1.85 GHz and 1.91 GHz).

It is to be noted that the use of an inventive filter structure is not bound to a particular frequency range. Neither the shape nor the characteristic parameters of the elements of the adaptation structure are characteristic for the present invention. The above rather presented an advantage of the present invention that may be realized in connection with various filters.

Figure 9:
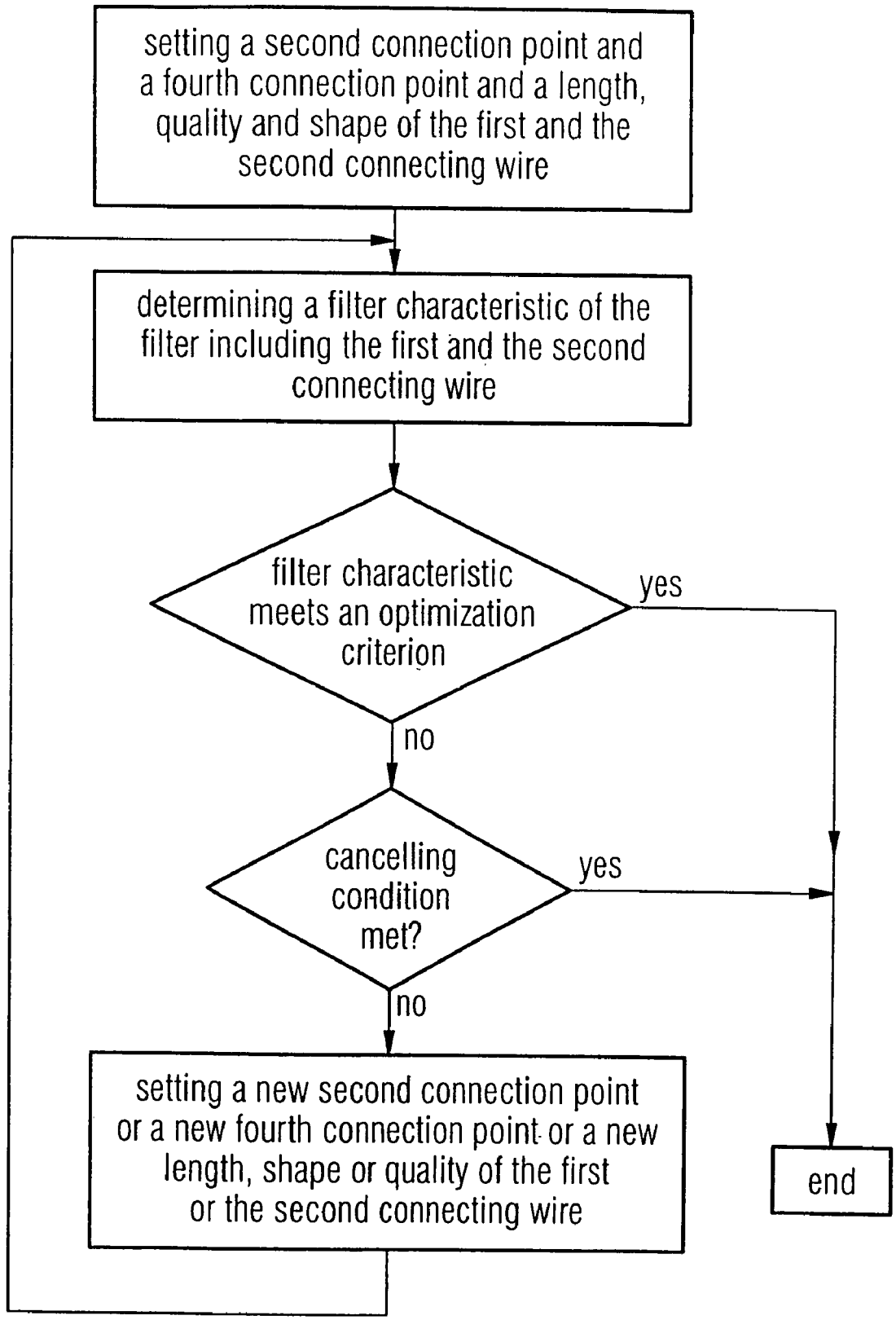
FIG. 9 is a flow diagram of an inventive method for the design of a filter.

FIG. 9 shows a flow diagram of an inventive method for the design of a filter structure. The used filter is assumed to include a BAW filter or a TFR filter having an input port and an output port. The input port comprises a first pad for receiving an input signal of the BAW filter or the TFR filter and a second pad for a first reference potential to which the input signal is related. The output port comprises a third pad for outputting an output signal of the BAW filter or the TFR filter and a fourth pad for a second reference potential to which the output signal is related. According to the declaration, the second pad and the fourth pad on the filter are isolated from each other. The filter is attached to a carrier comprising a reference potential area and an input signal area and an output signal area. The connection between the reference potential area and the second pad is established via a first connecting wire contacting the second pad at a first connection point and contacting the reference potential area at a second connection point. Similarly, the arrangement includes a second connecting wire contacting the fourth pad at a third connection point and contacting the reference potential area at a fourth connection point. Such a structure would be described, for example, with respect to FIG. 1. There is further defined a filter input port including a region of the input signal area and a region of the reference potential area. In a high frequency technology sense, this input port is a waveguide port allowing to measure or to simulatively determine wave magnitudes. Likewise, there is defined a filter output port including a region of the output signal area and a region of the reference potential area.

The definition of a filter input port and a filter output port on the carrier to which the filter is attached allows to determine and/or define a transmission characteristic for the whole filter structure including the bond wires connecting the metallization on the carrier to the actual filter.

The filter design is done in several steps shown in the flow chart in FIG. 9. In a first step, the geometry of the filter arrangement is to be set. The position of the second connection point at which the first connecting wire contacts the reference potential area and the fourth connection point at which the second connecting wire contacts the reference potential area are used as free parameters. Furthermore, length, quality and shape of the first and the second connecting wire are to be set. In a second step, the filter characteristic of the filter structure including the first connecting wire and the second connecting wire between the filter input port and the filter output port on the carrier material is determined. This may be done both by constructing the filter structure and measuring the transmission characteristic and by simulation of the filter structure. If the filter structure is constructed, the definition of the input port and the output port results in two reference levels being set for a measurement. Then the measurement system may be calibrated with respect to these reference levels.

Likewise it is possible to determine the filter characteristic of the filter structure by a computer simulation. For this, the entire geometry has to be input into the computer system in a form understandable for a machine. Furthermore it is necessary in many cases to determine a suitable discretization of the structure. This may be done manually or automatically. For the extraction of a transmission characteristic, the setting of reference levels is also necessary in a computer simulation. These are again given by setting a filter input port and/or a filter output port.

Depending on the case, it may be easier to construct and measure or to simulate a filter structure. This depends particularly on how complex the structure itself is, which simulation tools are available and to what extent process-induced tolerances can and should enter the description of a structure to be simulated.

After the determination of the filter characteristic, a third step checks whether the filter characteristic meets an optimization criterion. If that is the case, the method for filter design is ended. The current filter parameters are output and may be used for the production of further filters. If the optimization criterion has not been met, there may be a further check whether a cancelling condition has been met. For example, a maximum number of filter structures to be simulated or to be produced and measured may be preset. When this number is reached, the method is cancelled. Likewise, the cancelling condition may be temporal so that, for example, the method is ended after a certain period of time has expired. If the cancelling condition has not yet been met, at least one of the geometry parameters is changed. For example, a new second connection point or a new fourth connection point may be chosen. The length, shape or quality of the first or the second connecting wire may also be changed. Then the filter characteristic of the filter structure is again determined and the whole method is repeated for the new filter geometry. The method for filter design runs until either the filter characteristic meets an optimization criterion or a cancelling condition is met.

Very many criteria may be used as optimization criterion. For example, there may be a check whether the filter characteristic meets a given filter specification. If this is the case, the optimization criterion is assumed to be fulfilled. Although such a method does not ensure that the best possible filter characteristic is achieved, it guarantees the compliance with the specification, which is sufficient in many cases.

On the other hand, it is often advantageous to derive a feature based on the filter characteristic. This feature should contain a statement on how good a filter characteristic is with respect to given criteria. For example, the feature can be chosen so that a large feature value is achieved when a large (minimum or average) stop attenuation is achieved. The feature may further contain a statement on whether a filter specification is fulfilled. In this respect, a feature value and/or the feature is comparable to an optimization quantity used in optimization methods.

For example, the optimization criterion can be assumed to be met when the feature indicates that a filter characteristic is "better" than a given reference filter characteristic. A filter characteristic may also be required to be better than a given number of filter characteristics for which the given feature has already been determined. Furthermore, the checking for the compliance with the optimization criterion may be that only in the presence of feature values for a given number of filter structures there is a check which of the filter characteristics has the best feature value, i.e. fulfils the given task best.

The use of mixed methods evaluating both an optimization criterion and a cancelling condition independent of the filter characteristic is also possible. For example, the condition may be given that a certain feature value is to be reached. When the feature value is reached, the method is cancelled immediately. If, on the other hand, the feature value has not been reached after a certain given number of steps, the filter geometry is output for which the best feature value possible was achieved.

Besides the described opimization criteria, any other mathematical optimization method is also suited for the optimization of a filter structure as long as it is guaranteed that, after every optimization step, at least one of the filter parameters described above is changed. There may, for example, also be used gradient methods. It has to be noted here, though, that the number of the free parameters is very large so that multidimensional methods have to be used. Purely statistical optimization methods are also possible in which the filter parameters are chosen randomly.

Finally it is to be noted that other geometry parameters may be changed. For example, the first connection point at which the first connecting wire contacts the reference potential area and the third connection point at which the second connecting wire contacts the fourth pad may also be set variably in the course of the optimization of the filter structure. It is further possible to perform an optimization with respect to geometric details of the reference potential area, allowing a further improvement of the transmission characteristic.

Furthermore, the design method can make use of the finding that it is favorable when the distance between the second and the fourth connection point is smaller than the distance between the first and the third connection point. This may be included in the opimization as a boundary condition. Thus the value range of the free parameters is reduced. This results in an acceleration of the optimization method. Furthermore, it is to be noted that, in many cases, the inventive optimization methods converge towards exactly such a solution with the properties described above. Thus, if a physically reasonable configuration is chosen as an initial value, one can expect that an optimization method will converge faster.

The present invention is thus a novel concept for the optimization of the isolation and stop band suppression of a duplexer for a wireless communication terminal which may, for example, be used in a CDMA mobile radio system. The concept is based on the fact that the reception filter including a thin film resonator filter (TFR filter) or a bulk acoustic wave filter (BAW filter) is improved by an optimized bonding diagram with respect to its stop band suppression. The isolation between transmitter and receiver is also improved considerably. However, the isolation and stop band suppression in the transmission band are two important parameters in a duplexer. They provide for an interference-free operation of a wireless communication terminal, such as a mobile phone.

The present approach is based on a common optimization of the two grounds of the reception filter. The inductive coupling of the two grounds on the laminate carrier is used to increase the isolation and the stop band suppression in the transmission band in its broadbandness and thus improve the filter properties. No other external inductances are used for the optimization, so that the housing may be designed very compact. The functional principle was explained with respect to the bonding diagram shown in FIG. 4 and the equivalent circuit diagram shown in FIG. 6. The two left-hand short bond wires 790, 792 are for maintaining the inductance as low as possible with respect to the reference potential. The long, diagonal bond wires 794, 810, modelled by the inductances 940, 942, control the inductive coupling on the laminate. This is done by a suitable choice of the distance d of the two landing points on the laminate. This distance is modulated by the inductance 950. The smaller the distance d, the smaller the inductance between the two reference potentials. There is an optimal distance $d_{OPT}$ between the two landing points which depends on the structure of the carrier material 724. FIG. 8 shows a comparison of the filter characteristics of a conventional filter structure produced according to a conventional approach providing a separate optimization of the two reference potentials and an inventive filter structure. With an optimal length and position of the four bond wires 790, 792, 794, 810 for the reference potentials on the input and the output side, a significant improvement of the isolation, above all in the lower transmission band (1850 MHz to 1910 MHz) may be achieved. In the entire transmission band, the isolation is better than 55 dB.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A filter structure comprising:
    a filter including a bulk acoustic wave filter or a thin film resonator filter comprising an input port and an output port, wherein the input port includes a first pad for receiving an input signal of the bulk acoustic wave filter or thin film resonator filter and a second pad for a first reference potential to which the input signal is related, and wherein the output port comprises a third pad for outputting an output signal of the bulk acoustic wave filter or thin film resonator filter and a fourth pad for a second reference potential to which the output signal is related, and wherein the second pad and the fourth pad on the filter are isolated from each other;
    a carrier comprising a reference potential area;
    a first connecting wire contacting the second pad at a first connection point and contacting the reference potential area at a second connection point; and
    a second connecting wire contacting the fourth pad at a third connection point and contacting the reference potential area at a fourth connection point,
    wherein a first distance between the second connection point and the fourth connection point is smaller than a second distance between the first connection point and the third connection point.

2. The filter structure of claim 1, wherein the first connecting wire and the second connecting wire comprise bond wires.

3. The filter structure of claim 2, wherein the first connecting wire is operably connected to the second pad at a first connection point, and wherein the first connecting wire is operably connected to the reference potential area at the second connection point, and wherein the second connecting wire is operably connected to the fourth pad at the third connection point, and wherein the second connecting wire is operably connected to the reference potential area at the fourth connection point.

4. The filter structure of claim 1, wherein the carrier includes a laminate comprising at least one conductive outer layer on a surface of the laminate and at least one insulating layer, wherein the reference potential area comprises a part of the conductive outer layer.

5. The filter structure of claim 1, wherein the reference potential area includes a metallization.

6. The filter structure of claim 1, wherein the first, the second, the third and the fourth pad include a first, a second, a third and a fourth conductive region, wherein the first, the second, the third and the fourth conductive region are designed to allow the establishment of a conductive connection.

7. The filter structure of claim 1, wherein the first, the second, the third and the fourth pad include a first, a second, a third and a fourth metallization designed to allow the establishment of a conductive connection.

8. The filter structure of claim 1, wherein the filter is operably connected to the carrier.

9. The filter structure of claim 1, wherein the filter is glued to the carrier.

10. The filter structure of claim 1, wherein the reference potential area is designed to substantially surround a surface region of the carrier at which the filter is connected to the carrier.

11. The filter structure of claim 1, wherein the reference potential area is designed so that a point of the carrier next to the second pad is part of the reference potential area.

12. The filter structure of claim 1, wherein the filter is designed so that the first and the second pad are arranged along a first edge of the filter, and the third and the fourth pad are arranged along a second edge of the filter.

13. The filter structure of claim 12, wherein the first edge of the filter is opposite to the second edge.

14. The filter structure of claim 1, further comprising a third connecting wire designed to establish a connection between the second pad and the reference potential, the third connecting wire being shorter than the first connecting wire.

15. The filter structure of claim 14, wherein the third connecting wire is designed so that a length of the third connecting wire is minimized.

16. The filter structure of claim 14, wherein the third connecting wire is designed so that an inductance of the third connecting wire is minimized.

17. The filter structure of claim 1, wherein the filter comprises a band pass filter designed to attenuate an undesired spurious frequency range to a greater degree than a desired useful frequency range.

18. The filter structure of claim 1, wherein the filter is a reception filter designed to attenuate an undesired transmission frequency range to a greater degree than a reception frequency, in a transmission from the input port to the output port.

19. The filter structure of claim 1, wherein the bulk acoustic wave filter or thin film resonator filter includes a resonator designed to filter the signals transmitted from the input port to the output port.

20. The filter structure of claim 1, wherein the filter includes a first series resonator and a second series resonator as well as a first parallel resonator and a second parallel resonator, wherein the first series resonator is coupled to the first pad, wherein the second series resonator is coupled to the third pad, wherein the first parallel resonator is coupled to the second pad, and wherein the second parallel resonator is coupled to the fourth pad.

21. The filter structure of claim 1, wherein the first connecting wire and the second connecting wire are designed so that a direct coupling between the two connecting wires is minimal.

22. The filter structure of claim 1, wherein a coupling inductance between the second connection point and the fourth connection point is smaller than a wire inductance of the first connecting wire and the second connecting wire.

23. A method for the design of a filter structure having a filter including a bulk acoustic wave filter or a thin film resonator filter having an input port and an output port, wherein the input port includes a first pad for receiving an input signal of the bulk acoustic wave filter or thin film resonator filter and a second pad for a first reference potential to which the input signal is related, and wherein the output port comprises a third pad for outputting an output signal of the bulk acoustic wave filter or thin film resonator filter and a fourth pad for a second reference potential to which the output signal is related, and wherein the second pad and the fourth pad on the filter are isolated from each other, and a carrier to which the filter is attached and which comprises a reference potential area, an input signal area and an output signal area, and wherein the input signal area is connected to the first pad by a first connecting wire, and wherein the output signal area is connected to the third pad by a second connecting wire, and wherein the reference potential area is connected to the second pad by a third connecting wire, and wherein the reference potential area is connected to the fourth pad by a fourth connecting wire, the method comprising:

setting a first connection point at which the third connecting wire contacts the reference potential area and a second connection point at which the fourth connecting wire contacts the reference potential area;

determining a filter characteristic of the filter structure including the first, the second, the third and the fourth connecting wire between a first port on the carrier and a second port on the carrier, wherein the first port is a region of the input signal area and includes a region of the reference potential area, and wherein the second port includes a region of the output signal area and a region of the reference potential area;

checking whether the filter characteristic meets an optimization criterion; and repeating the steps of setting geometry parameters, determining a filter characteristic and checking whether the filter characteristic meets an optimization criterion, if the filter characteristic does not meet the optimization criterion, until the filter characteristic meets the optimization criterion or a cancelling condition has been reached, wherein, in the repetition of the step of setting the geometry parameters, the first connection point, the second connection point, a length, a quality or a shape of the third connecting wire or the fourth connecting wire is changed.

24. The method of claim 23, further comprising:
setting a third connection point at which the third connecting wire contacts the second pad and a fourth connection point at which the fourth connecting wire contacts the fourth pad.

25. The method of claim 23, wherein a distance between the first and the second connection point is smaller than a distance between the third and the fourth connection point.

26. The method of claim 23, wherein determining the filter characteristic includes constructing a corresponding filter and measuring the filter characteristic.

27. The method of claim 23, wherein determining the filter characteristic includes simulating the filter with the aid of the software that is executed on a programmable computer.

28. The method of claim 23, wherein the optimization criterion includes a statement on whether the filter characteristic fulfils a given filter specification.

29. The method of claim 23, wherein the optimization criterion includes a statement on whether the filter characteristic is better than a given reference filter characteristic with respect to a given feature derivable from the filter characteristic.

30. The method of claim 23, wherein the optimization criterion includes a statement on whether, with respect to a given feature derivable from the filter characteristic, a filter characteristic is better than a given number of filter characteristics for which the given feature has already been determined in the course of the method.

31. The method of claim 23, further including a step of storing a given feature derivable from the filter characteristic, and wherein the cancelling criterion is reached when a given number of iterations has been performed, and further including a step of choosing the filter structure from the plurality of examined filter structures in which the given stored feature has an optimal value with respect to requirements.

* * * * *